(12) United States Patent
Chang (10) Patent No.: US 6,285,604 B1
(45) Date of Patent: Sep. 4, 2001

(54) DUMMY MEMORY CELLS FOR HIGH ACCURACY SELF-TIMING CIRCUITS IN DUAL-PORT SRAM

(75) Inventor: Meng-Fan Chang, Taipei (TW)

(73) Assignee: Taiwan Semiconductor Manufacturing Co., Ltd. (TW)

(*) Notice: Subject to any disclaimer, the term of this patent is extended or adjusted under 35 U.S.C. 154(b) by 0 days.

(21) Appl. No.: 09/478,739

(22) Filed: Jan. 6, 2000

(51) Int. Cl.[7] ................................................. G11C 7/00
(52) U.S. Cl. ............................ 365/200; 365/202; 365/203
(58) Field of Search .................................... 365/156, 200, 365/203, 189.08, 189.09, 205, 207, 202

(56) References Cited

U.S. PATENT DOCUMENTS

| | | | |
|---|---|---|---|
| 5,432,731 | * 7/1995 | Kirsch et al. | 365/145 |
| 5,822,237 | * 10/1998 | Wilson et al. | 365/145 |
| 5,901,077 | * 5/1999 | Nishimura | 365/145 |
| 6,026,009 | * 2/2000 | Choi et al. | 365/145 |

\* cited by examiner

Primary Examiner—Richard Elms
Assistant Examiner—Hien Nguyen
(74) Attorney, Agent, or Firm—Baker Botts LLP (57) ABSTRACT

A dummy memory cells for high-accuracy self-timing circuit in dual-port SRAM is disclosed herein. The dummy memory cells mentioned above include a plurality of word lines, two pairs of bit lines, two pairs of load circuits and an array of dummy memory cells. The plurality of word lines is utilized to receive an access signal, the two pairs of load circuit are connected to the two pairs of bit lines respectively for applying to a voltage source. The array of dummy memory cells includes a first group of dummy memory cells and a second group of memory cells. Each of the first group of dummy memory cells having a first inverter assuming a first binary state is coupled to a first bit line, and has a first word line. The second group of dummy memory cells for acting as loading having a second inverter assuming a second binary state, each of the second inverter being coupled to the first bit line. Each of the second group of dummy memory cells having a second word line, the second word line of each of the second group of dummy memory cells is coupled to a source voltage level. The voltage on the two pairs of bit lines coupling to the array of dummy memory cells tracks the voltage drop on a normal bit line when the access signal arriving a normal memory cells coupled to the normal bit line.

19 Claims, 9 Drawing Sheets

Fig.8

DUMMY MEMORY CELLS FOR HIGH ACCURACY SELF-TIMING CIRCUITS IN DUAL-PORT SRAM

BACKGROUND OF THE INVENTION

1. Field of the Invention

This invention relates generally to a dummy cells utilized in a high accuracy self-timing circuits in dual-port SRAM (Static Random Access Memory), and particularly relates to a dummy cells utilized in a high accuracy self-timing circuits in dual-port SRAM which operates with high speed and low power.

2. Description of the Prior Art

In a prior art static random access memory where each memory cell is supplied with a voltage through a bit line from a circuit that serves as a load of the driving transistor of the cell through a gate-controlled coupling transistor, a voltage developed at the bit line is determined by the discharging current passing through the ON coupling transistor and the driving transistor of the cell. Since the operational characteristics of these transistors vary with device variabilities due to manufacture and temperature variations, the memory is designed with a safety margin to accommodate such factors, and hence, the operational performance of the memory cannot be exploited to the fullest extent.

Especially in designing modern embedded SRAM, the self-timing control circuits become more popular for speeding up the access time and cycle time or employing latch type sense amplifiers due to the trend of high-speed device and low power application. However, the accuracy of the self-timing control circuits is getting worse as the process shrinking and narrow width device employed in memory bit cells. Moreover, the accuracy of the self-timing circuit is also vulnerable to the minor process variation. The timing inaccuracy of the self-timing circuit is greatly attributed to the activity of the bit-lines.

In a conventional case of a self-timing circuit, only the capacitance of bit lines is simulated when tracking the activity of bit lines. Though, in some advanced design, it also simulates the resistance of the bit line as well, the current source utilized to drive the dummy bit line is not as accurate as the real memory cell. In other words, the voltage drop on the dummy bit line can not be coincide with the voltage drop on the bit line of the real memory cell. So in most design of self-timing circuit, the simulation of bit line loading and access activity are not accurate enough.

As the process shrinks, and narrow width devices are employed nowadays, the differences in electrical characteristics between mid-size device and narrow width device become more critical. Besides, for embedded memory in logic process, the logic SPICE model provided by foundry does not usually reflect the activity of memory cell with very high accuracy, especially when they have some extra processes for embedded memory cells. Therefore, the less accurate current source for the dummy bit line could cause timing inaccuracy than before.

Figure 1A:
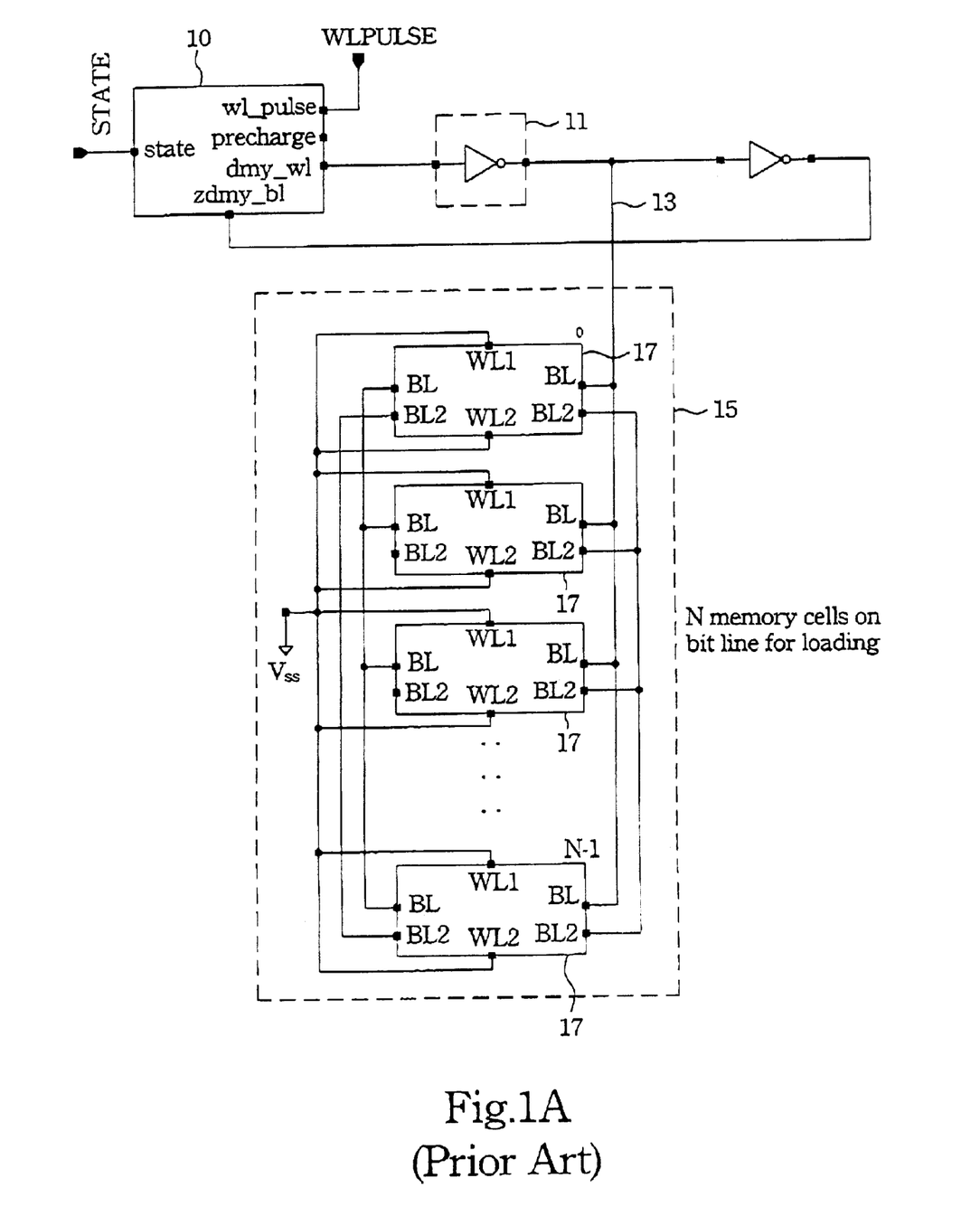
FIG. 1A illustrates the conventional dummy memory cell array using the inverter as the current source.
Figure 2:
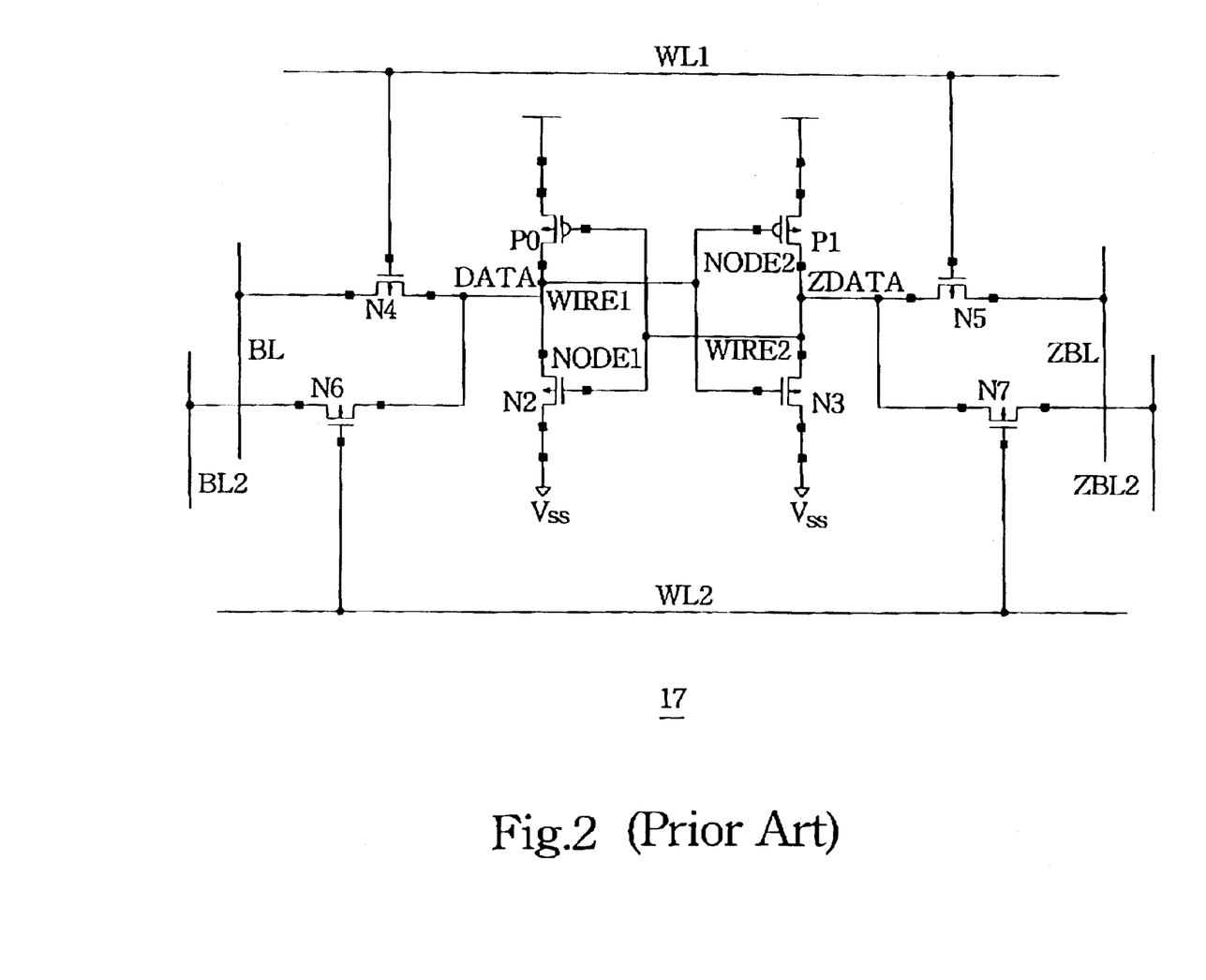
FIG. 2 illustrates the circuitry of the conventional memory cell.

To illustrate the conventional self-timing circuit utilizing the dummy bit-line in the embedded memory cell, the configuration of the control circuit as well as the pattern of the dummy memory cells are shown in FIG. 1. As an example, the control circuit in FIG. 1 can be the word line pulse generator 10, and the word line pulse is transmitted from terminal dmy_wl of word line pulse generator 10 to the inverter 11. Then the inverter 11 precharges the loading composed of N dummy half-memory cells. The bit line 13 is connected to the output terminal of the inverter 11; also, the bit line 13 is connected to the memory cell column 15 that is composed of a plurality of memory cells acting as the loading of the inverter 11. Each component of the plurality of memory cells is a memory cell 17 (or a half memory cell). The memory cell 17 is a dual-port memory cell whose circuitry is shown in FIG. 2, in which the word line WL1 and the word line WL2 are respectively connected to the gates of the transistors N4, N5, and the gates of the transistors N6, N7. The source of the transistors N4 and N6 are coupled at a point DATA, and the drain of the former are connected to the bit line BL and BL2 respectively. Similarly, the source of the transistors N5 and N7 are coupled at a point ZDATA, and the drain of the former are connected to the inverse of the bit line ZBL and ZBL2 respectively. The gate of the transistor P0 is coupled to the gate of the transistor N2 through the point NODE1; in addition, the drain of the transistor P0 is coupled to the drain of the transistor N2 at the point DATA. The source of the transistor P0 is coupled to Vdd and the source of the transistor N2 is coupled to the voltage Vss. The gate of the transistor P1 is coupled to the gate of the transistor N3 through the point NODE2; in addition, the drain of the transistor P1 is coupled to the drain of the transistor N4 at the point ZDATA. The source of the transistor P1 is coupled to Vdd and the source of the transistor N3 is coupled to the voltage Vss. Besides, a wire WIRE1 couples the point DATA to the point NODE2, and a wire WIRE2 couples the point ZDATA to the point NODE1.

Figure 1B:
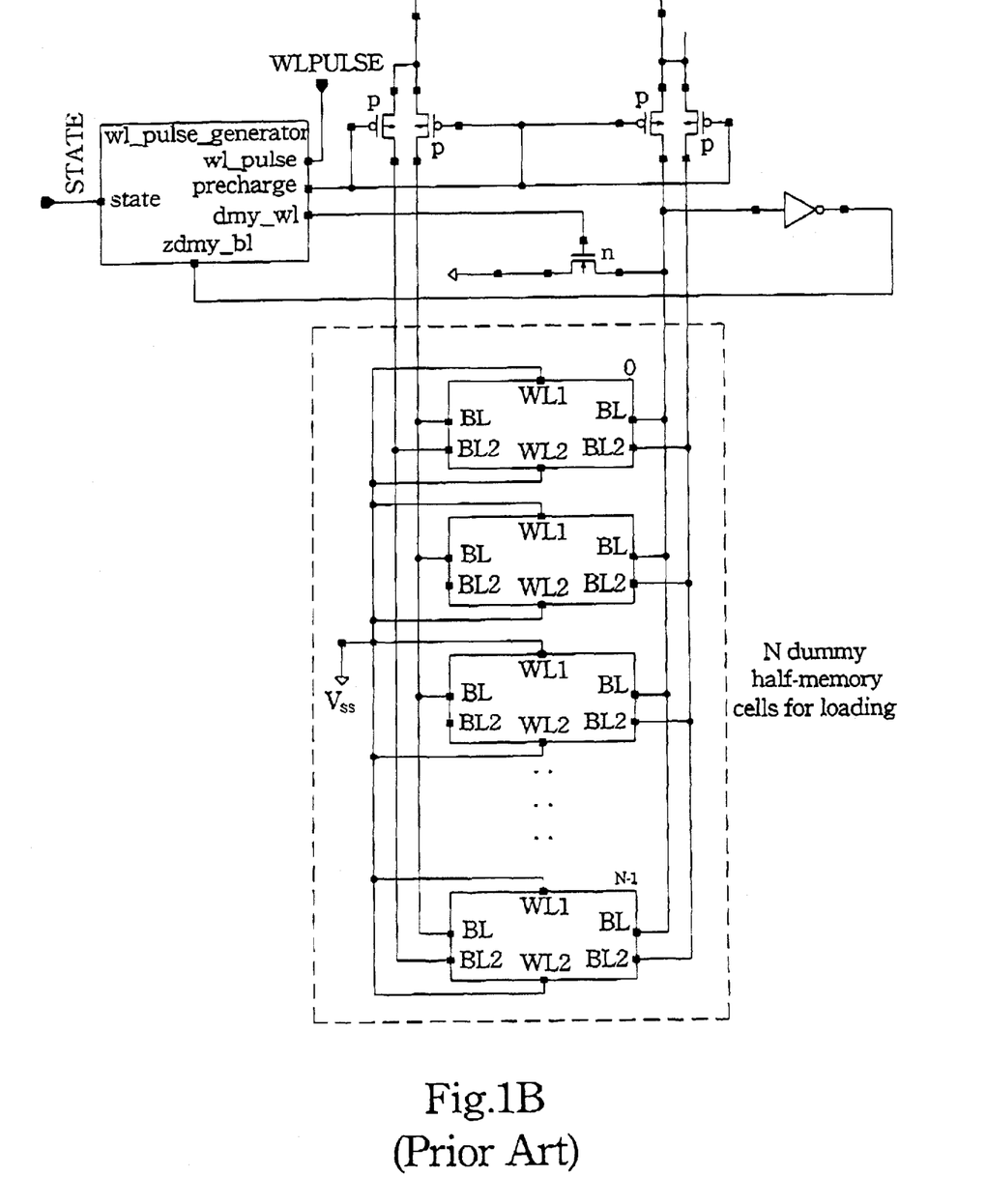
FIG. 1B illustrates the conventional dummy memory cell array using the NMOS as the current source.

In the other example of the prior art dummy memory cell array, the inverter 11 can be replaced with a transistor such as a NMOS, and the circuitry is shown in FIG. 1B. To obtain a high-speed element, time margin should be reduced to a minimum. So it is better to track the voltage on the bit line of the normal memory cell array, and then the time margin is saved. However, no matter what type of the prior art dummy memory cell array is used, the voltage on the dummy bit line can not exactly track the voltage on the normal memory cell due to the following reasons. First, the current source in the prior art dummy memory cell is inverter or transistor, in addition, the gate width and gate length of the current source as well as the layout utilized in the prior art is different from that of the normal memory cell. So the discharge current on the normal bit line is not the same as that on the dummy bit line. Secondly, the process that utilized to fabricate the inverter NMOS is different from that of the memory cell.

In addition, the design of the memory cell concerning the pattern of the dummy bit line and the loading does not take the worst case of loading into account. Thus, when a plurality of loading memory cells coupled to the bit line are logic "1" or high voltage, and both WL1 and WL2 are accessed, the voltage on the dummy bit line can not exactly track the voltage on the bit line of the normal memory cell. Especially, when the number of the memory cell continuously increases with the trend of high-density element, the difference of loading capacitance will seriously affect the precision of tracking the voltage on the normal bit line. Due to the reasons mentioned above, it is necessary to improve the dummy memory cell to obtain a high-speed element.

SUMMARY OF THE INVENTION

To accurately emulate the activity (such as voltage variation) of the bit lines in the memory array under high speed, the present invention proposes a dummy bit line with dummy memory cells that can be used to track the voltage variation on the normal bit lines of the dual-port static random access memory. The dummy memory array mentioned above includes a word line, two pairs of bit lines (one for dummy bit line, the other for connectivity), two pairs of load circuit, and a column of dummy memory cells.

The dummy word line is used to receive an access signal. The two pairs of load circuit connected to said two pairs of bit lines respectively is used to precharge the dummy bit line in precharging cycle. The voltage on the two pairs of bit lines coupling to the array of memory cells track the voltage drop on a normal bit line when the access signal arriving a normal memory cells coupled to said normal bit line. The normal bit line is electrically coupled to the voltage source. Each component of the array of memory cells includes two pairs of coupling transistors having a control terminal connected to a word line, and a pair of inverters connected in anti-parallel relationship to each other. Each of the coupling transistors establishing a conductive path between one of the two pairs of bit lines and one of the pair of inverters responsive to the access signal to cause the pair of inverters to assume one of two binary states. The gates of one of the pair of inverters is coupled to the voltage source, the gates of the other of the pair of inverters is coupled to a source voltage level. A first control terminal of a first transistor in the two pairs of coupling transistors is coupled to a second control terminal of a second transistor of the other of the two pairs of coupling transistors.

The memory mentioned above can be a dual-port static random access memory (DPSRAM). The two pairs of load circuits include a first field effect transistor, a second field effect transistor, a third field effect transistor and a fourth field effect transistor. Each of them has a source-drain path connected between the voltage source and the array of memory cells. The gate of the first field effect transistor is coupled to the gate of the third field effect transistor, the gate of the second field effect transistor, and the gate of the fourth field effect transistor.

Wherein the array of memory cells further includes a first group of memory cells and a second group of memory cells. The first group of memory cells is used to provide current, and the first group of memory cells acts as driver in the array of memory cells. The second group of memory cells is used to receive the current from the first group of memory cells, the second group of memory cells acts as loading in the array of memory cells. Each of the first group of memory cells has a first inverter assuming a first binary state, and is coupled to a first bit line of the two pairs of bit lines. Each of the first group of memory cells has a first word line, the first word line of each of the first group of memory cells is coupled to access the access signal.

Each of the second group of memory cells has a second inverter assuming a second binary state, and is coupled to the first bit line of the two pairs of bit lines. Each of the second group of memory cells has a second word line, the second word line of each of the second group of memory cells is coupled to the source voltage level.

To obtain a circuitry utilized to track the voltage variation on the normal bit line, a trigger device is electrically coupled to the first bit line mentioned above, and the output of the trigger device is coupled to the control circuit generating the access signal. The trigger device in the preferred embodiment of the present invention can be an inverter of the Schmitt trigger.

BRIEF DESCRIPTION OF THE DRAWINGS

The above features of the present invention will be more clearly understood from consideration of the following descriptions in connection with accompanying drawings in which.

DESCRIPTION OF THE PREFERRED EMBODIMENT

In order to exactly track the voltage on the bit line of the normal memory cell under various kind of working conditions, the process used to fabricate the dummy bit line is also used to fabricate the normal bit line. In addition, the width and length of the layout of the transistors in the dummy memory cell in the present invention should identical with that of the normal memory cell to provide the dummy bit line the current that is the same as that of the bit line in the normal memory cell. Due to the capacitance between the bit line and the memory cell, the time constant of the bit line in the normal memory cell is increased especially when the number of the memory cell is increased. However, the bit line in the dummy memory cell does not positioned on the dummy memory cell, so the capacitance effect of the dummy bit line is not the same as that of the bit line in the normal memory cell. So the prior art cannot exactly track the voltage on the bit line.

Figure 3A:
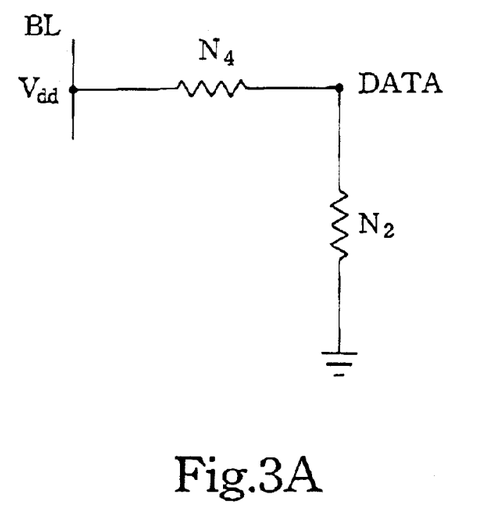
FIG. 3A illustrates the equivalent circuit of the access transistor when one port of the memory cell is in its "read" operation.
Figure 3B:
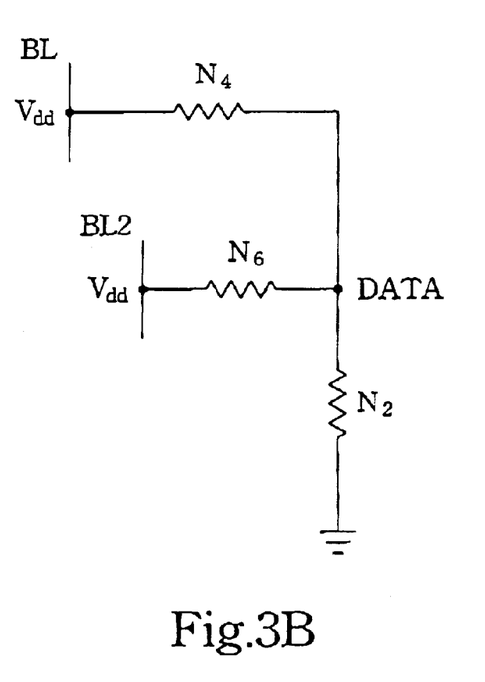
FIG. 3B illustrates the equivalent circuit of the access transistor when both ports of the memory cell are in "read" operation.

According to the disadvantages mentioned above, the present invention proposes the dummy memory cell that has the same transistor (MOS: Metal Oxide Semiconductor) layout as that of the normal memory cell. Because the process utilized to fabricate the transistor of the dummy memory cell is identical with that of the normal memory cell, so the current in the current source of the dummy memory cell is the same as that of the normal memory cell. In addition, the present invention uses the memory cell as the dummy memory cell, which has the wires WIRE1 and WIRE2 eliminated, and has the word lines WL1 and WL2 connected (FIG. 2). The circuitry of the dummy memory cell according to the preferred embodiment of the present invention is shown in FIG. 3. Thus the present invention can simulate the situation that both the two ports are of high voltage level, in other words, when the worst case happened, the memory cell according to the present invention can simulate the current in the worst case.

To explain the worst case happened in the memory cell array, the equivalent circuits of the access transistor are illustrated in FIG. 3A and FIG. 3B. When the memory cell is in operation, it could happen that the two ports of the memory cell is in "read" operation. At this moment, the two word lines (such as WL1 and WL2 in FIG. 2) are in the logic high voltage level, so the access transistors (such as N4, N6, N5, N7 in FIG. 2) are equivalent to resistors in circuitry. Turning back to FIG. 2, when one port is in the "read" operation, i.e., one port is on logic high voltage level, the bit line BL is on logic high voltage level, and the transistor N4 is turned on. So the equivalent circuit of the transistors N4 and N2 are resistors in FIG. 3A. However, when both ports are in the "read" operation, i.e., two ports are on logic high voltage level, the bit lines BL and BL2 are on logic high voltage level, and the transistor N4 as well as N6 are turned on. So the equivalent circuit of the transistors N4, N6, and N2 are resistors, and the voltage on each node is shown in FIG. 3B. The voltage on the node DATA in FIG. 3B is larger than that in FIG. 3A because of the parallel connection of the transistor N4 and N6, which occurred in the two-port "read" operation.

Due to the voltage bump on the node DATA in the two-port "read" operation is larger than that in the one-port "read" operation, the threshold voltage of the transistor N4 is raised due to the body effect of the transistor N4 resulted from the voltage raise at the node DATA. Because the source-drain current in the transistor N4 is proportional to the voltage drop between the drain and source subtracted by the threshold voltage, the source-drain current of the transistor N4 is thus lowered. Accordingly, the current on the bit line in the worst case, in which two ports are in logic high voltage level, is different from the current with only one port in the "read" operation. In addition, each access transistor (such as N4 and N6) of the conventional memory cell is coupled to the word line (such as WL1 and ML2) overpassing the memory cells respectively. So the layout issue is complex, and the word lines crossing the dummy memory cells may result in unexpected effects. Thus it is better to reduce the number of word line which crossing the dummy memory cells by using another metal layer to connect the two word lines needed inside dummy memory cells. The WL1 and WL2 for normal memory cells take space to cross the dummy cells to reach normal memory cells.

Figure 4:
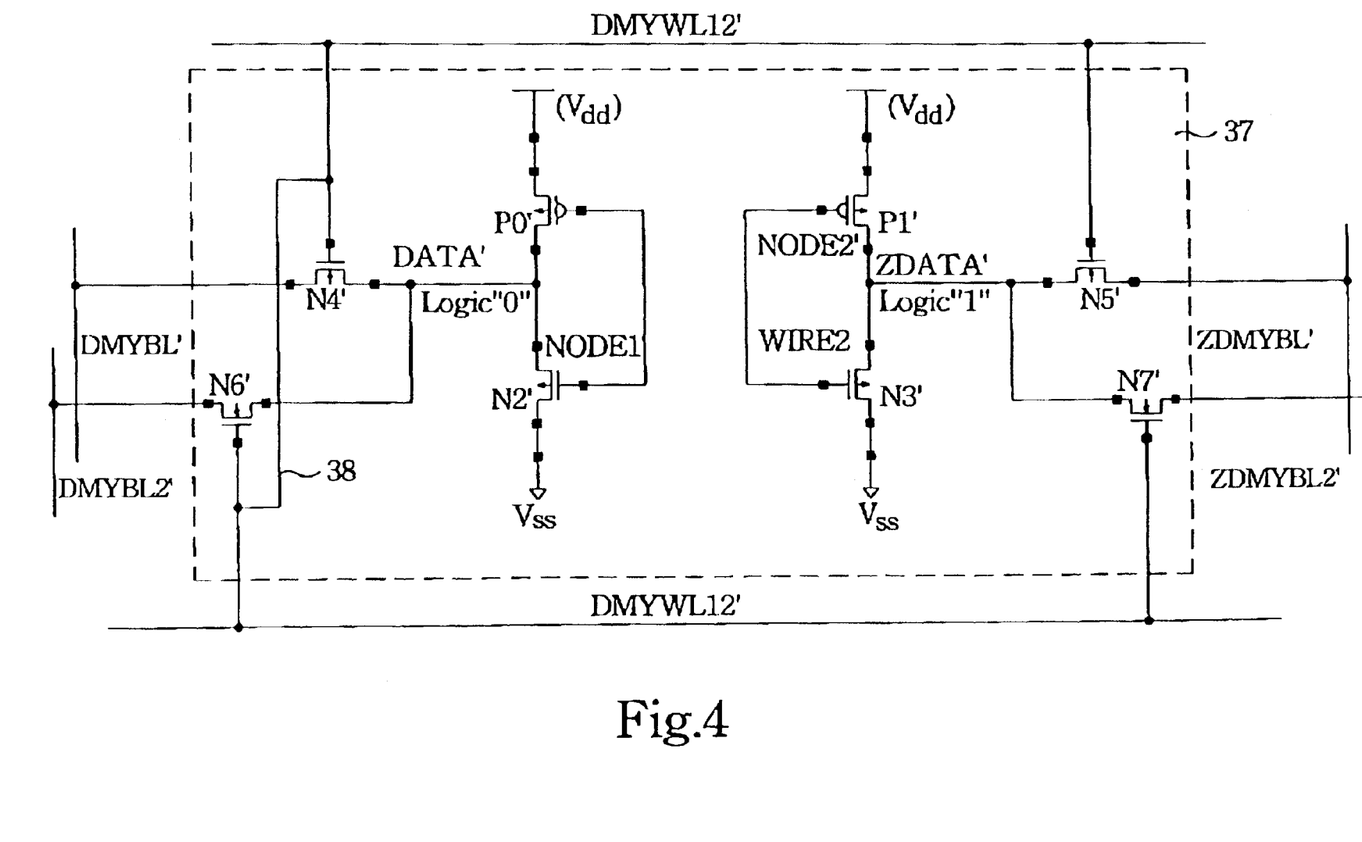
FIG. 4 illustrates the circuitry of the memory cell utilized in dummy memory cell array in the preferred embodiment of the present invention.

The present invention proposes a kind of memory cell utilized in the dummy memory cell array, and the circuitry of the dummy memory cell according to the present invention is shown in FIG. 4. As illustrated in FIG. 4, the memory cell 37 is a dual-port memory cell for a dual-port SRAM, in which the word line DMYWL12' in the dummy memory cell is coupled to the gates of the transistors N4', N5', and the gates of the transistors N6', N7'. The source of the transistors N4' and N6' are coupled at a point DATA', and the drain of the former are connected to the bit line DMYBL' and DMYBL2' respectively. The gate of the N4' are connected to the gate of N6'. Similarly, the source of the transistors N5' and N7' are coupled at a point ZDATA', and the drain of the former are connected to the inverse of the bit line ZDMYBL' and ZDMYBL2' respectively.

The gate of the transistor P0' is coupled to the gate of the transistor N2' through the point NODE1' to the voltage Vdd (or ground); in addition, the drain of the transistor P0' is coupled to the drain of the transistor N2' at the point DATA'. The source of the transistor P0' is coupled to the point NODE1' and the source of the transistor N2' is coupled to the voltage Vss. The gate of the transistor P1' is coupled to the gate of the transistor N3' through the point NODE2' to the voltage Vss; in addition, the drain of the transistor P1' is coupled to the drain of the transistor N3' at the point ZDATA'. The source of the transistor P1' is coupled to Vdd (or ground) and the source of the transistor N3' is coupled to the voltage Vss. It is noted that there is no cross coupling the point NODE1' and the point NODE2' in the dummy memory cell utilized in the present invention, and which is one of the differences to the prior art dummy memory cell.

Figure 5:
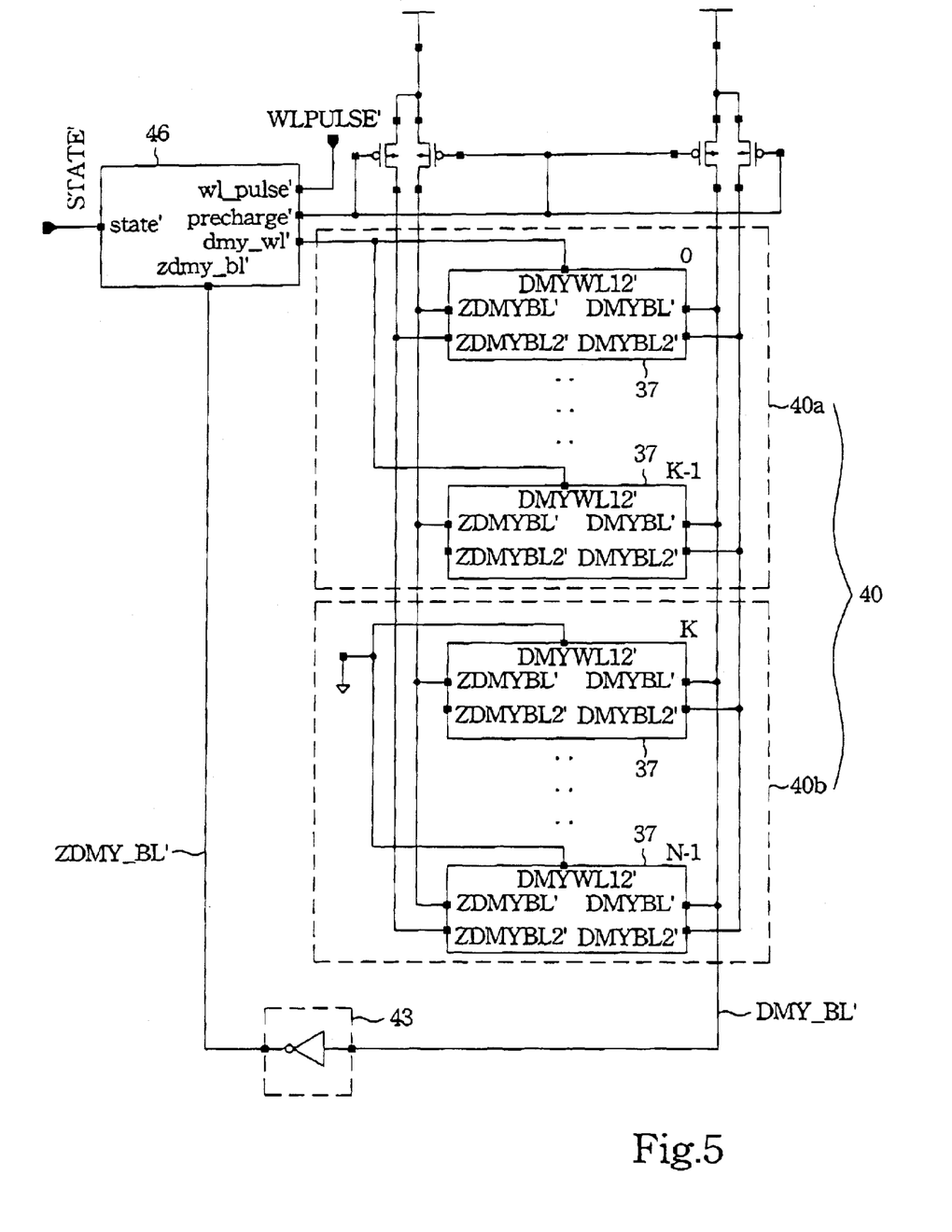
FIG. 5 illustrates the circuitry emulating activity of bit line of dual-port SRAM which including the dummy memory cell array in the preferred embodiment of the present invention.

When the memory cell 37 shown in FIG. 4 is used in the present invention as the dummy memory cell, the circuitry of the dummy memory cell array in the preferred embodiment of the present invention can be illustrated as shown in FIG. 5. The word line DMYWL12' (FIG. 4) is connected to the terminal DMYWL12' (FIG. 5), the bit line DMYBL' (FIG. 4) is connected to the terminal DMYBL' (FIG. 5), the bit line DMYBL2' (FIG. 4) is connected to the terminal DMYBL2' (FIG. 5), the inverse of the bit line ZDMYBL' (FIG. 4) is connected to the terminal ZDMYBL' (FIG. 5), and the inverse of the bit line ZDMYBL2' (FIG. 4) is connected to the terminal ZDMYBL2' (FIG. 5).

In addition, the current source 40a provides current for the loading 40b. Assume the memory cell array 40 is composed of n memory cells, the current source 40a can be composed of k memory cells, and k can be 4 in one preferred embodiment of the present invention. Generally the value of k is no less than 4. The loading 40b in one preferred embodiment of the present invention can be composed of (n-k) memory cells. The signal from the dummy word line terminal dmy__wl' of the control circuit 41 is fed to the terminal DMYWL12' of each of the memory cell of the current source 40a. The current source 40a acts a driver to provide current for the memory cells of the loading 40b.

Figure 6:
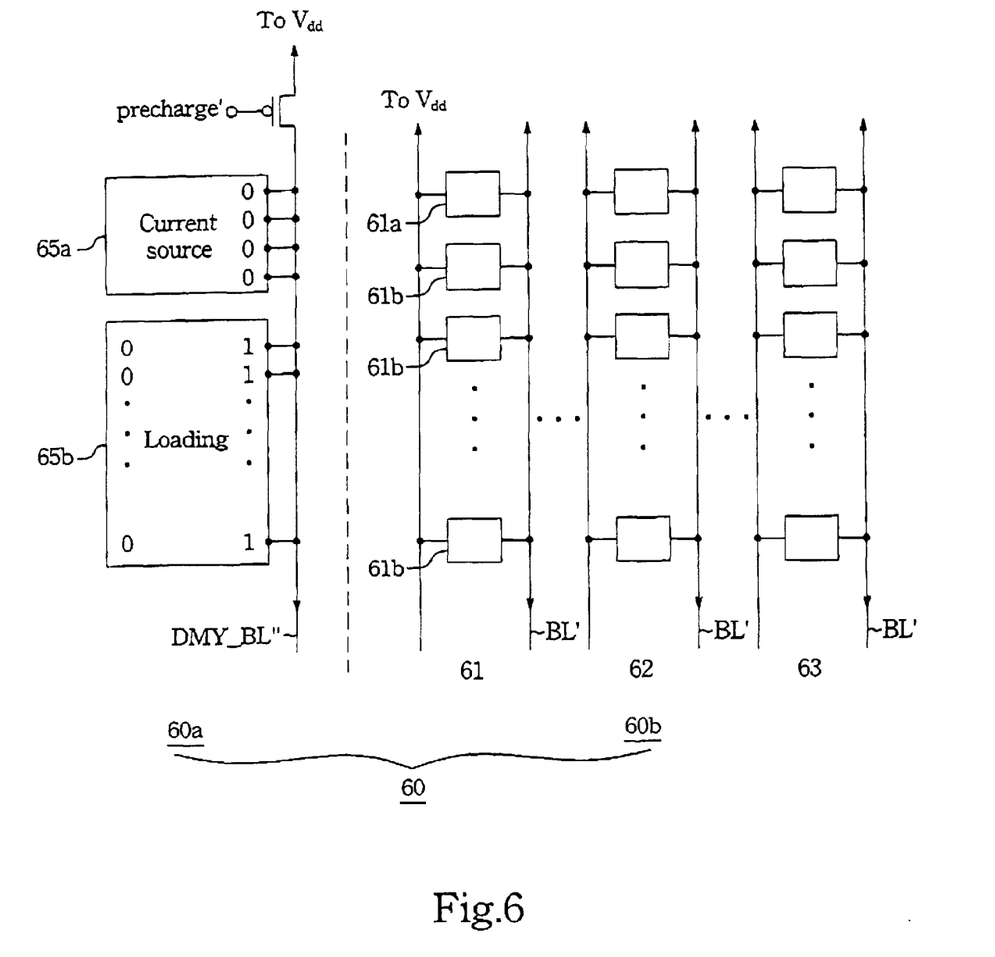
FIG. 6 illustrates the pattern of the dummy memory cell on the dummy bit line and illustrates the arrangement of the dummy memory cell array as well as the normal memory cell array in the preferred embodiment of the present invention.

The current from the k memory cells of the current source 40a is fed to the inverter 43 through the dummy bit line DMY__BL', and the output of the inverter 43 is the inverse dummy bit line—ZDMY__BL' which is the inverse of the dummy bit line—DMY__BL'. The signal on inverse dummy bit line is fed from the inverter 43 to the zdmy__bl' terminal of the control circuit 46 (such as word line pulse generator). The inverter 43 is a trigger device, which can be a Schmitt trigger in the preferred embodiment of the present invention. Then the word line pulse is output from the terminal—wl__pulse' of the control circuit 46 to the point WLPULSE'. Every one of the plurality of PMOS in FIG. 6 is used for bit-line precharge. When a bit-line is accessable, the PMOS coupled to the bit-line is "off", whereas, when the bit-line access is finished, the PMOS coupled to the bit-line is "on" to precharge the corresponding memory cell coupled to the PMOS to Vdd for next access.

To further illustrate the operation of the normal memory cell array cooperative with the dummy memory cell array, the arrangement of the normal memory cell array and the dummy memory cell array according to the preferred embodiment of the present invention is illustrated in FIG. 6. The dummy memory cell area 60a and the normal memory cell area 60b are within a area 60 in a die, so the process utilized to fabricate the elements within the dummy memory cell area 60a are the same as that within the normal memory cell area 60b.

Thus the characteristic (such as capacitance and resistance) of the dummy bit line DMY__BL' in the dummy memory cell area 60a is the same as that of the normal bit line BL in the normal cell area 60b. In an example, the normal memory cell array area 60b includes a plurality of normal memory cell arrays such as 61, 62, and 63. The normal memory cell array 61 includes a memory cell 61a used as a driver and a plurality of memory cells 61b used as the loading. The memory cell (such as 61a or 61b) used in the normal memory cell area 60b is of the same structure of the memory cell 17 (FIG. 1A).

The dummy memory cell array 65 includes a current source 65a and a loading 65b. In the preferred embodiment of the present invention, the current source 65a includes 4 memory cells proposed in the present invention, which is of the same structure as memory cell 37 (FIG. 4). The two word-lines of the proposed memory cell in the dummy memory cell area 60a are wired together, and the memory cells within the current source 65a are controlled by the control circuit 46 (illustrated in FIG. 5). The transistors storing logic "0" in the memory cells within the current source 65a are coupled to the dummy bit line DMY_BL' as illustrated in FIG. 6. In addition, the pattern of the loading 65b is illustrated in FIG. 6, in which the transistors storing logic "1" in the memory cells within the loading 65b are coupled to the dummy bit line DMY_BL'.

So the dummy memory cell according to the present invention can emulate the worst discharging current on bit lines when a dual-port memory cell is read accessed on its both ports simultaneously. It is noted that, in the modern memory cell design, metal wires are frequently employed as the cross coupling wires, a little difference in metal wires will not make the transistors in dummy memory cell mismatch with the transistors in normal memory cell during back-end processes. However, it is necessary for both of the two inverters (P0' coupled with N2' and P1' coupled with N3' to form the same device pattern as the normal cells to prevent OD and POLY (not shown) mismatch in front-end processes. Therefore, with an extra wire 38 (FIG. 4) coupling the two word lines DMYWL12' and without cross coupling wires (WIRE1 and WIRE2 in FIG. 2) in the memory cell within the proposed dummy dual-port memory cell can provide the same discharging current as normal memory cells do. Therefore, with an extra wire 38 (FIG. 5) coupling the two word lines DMYWL12' and without cross coupling wires (WIRE1 and WIRE2 in FIG. 3) in the memory cell within the proposed dummy dual-port memory cell can provide the same discharging current as normal memory cells do.

Further, because the pattern (arrangement of the transistors storing logic value "1" coupled to dummy bit line) of the loading 65b, the capacitance effect from those inactive cells on dummy bit line is against voltage dropping. Since the main purpose of the dummy bit line is to emulate the discharging activity of normal bit lines, the pattern of the loading 65b will present the worst capacitance loading on bit lines for discharging from the pre-charged value. Thus it is ensured that the voltage drop of the dummy bit line can track the voltage drop of the normal bit lines. In the traditional circuit utilized to emulate the voltage variation on the normal bit line, the voltage on the traditional dummy bit line does not vary linearly with the voltage variation on the normal bit line. However, the circuit utilized to emulate the voltage variation on the normal bit line has the electrical characteristic that the voltage on the dummy bit line in the present invention can vary linearly with the voltage variation on the normal bit line. So the present invention can highly accurately emulate the voltage on the normal bit line no matter how many memory cells are employed as the current source. If the process employed to fabricate the memory cell and the bit line is changed, the current in the dummy bit line in the prior art may shift. Thus the simulation for the current on the normal bit line failed in the prior art, however, the current in the dummy bit line in the present invention can accurately simulate the current on the normal bit line in spite of the process variation. In conclusion, the present invention can accurately emulate the voltage on the normal bit line in spite of the process variation, the operation temperature variation, and the variation of Vdd.

With a dummy memory cell providing the identical discharging current as regular memory cells do and the worst pattern of capacitance loading for bit lines discharging, the voltage drop of this dummy bit line with K cells is always around K times as the smallest voltage drop of normal bit lines. For example, the voltage variation during discharging of a normal memory cell is illustrated as line 80 shown in FIG. 7, and the voltage variation during discharging of a dummy memory cell is illustrated as line 81, which represents that K memory cells are utilized as current source. Because the present invention can accurately provide the voltage simulation linearly varied responding to that of the normal bit line, the timing control in the next stage is possible in the present invention.

Figure 8:
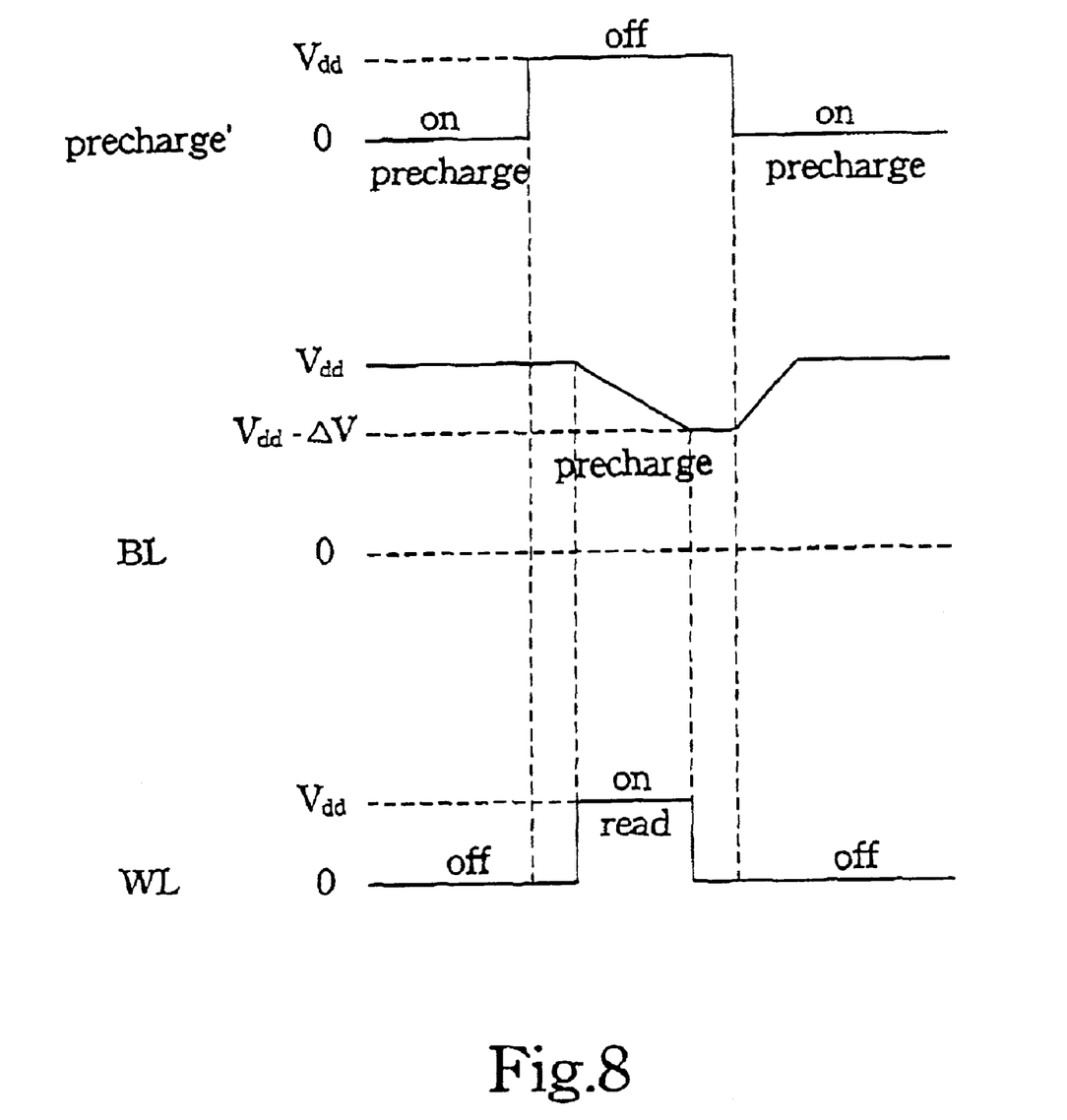
FIG. 8 illustrates the operation of the precharge circuit as well as the voltage variation of the PMOS controlled by the terminal precharge', the bit line BL, and the NMOS controlled by the word line WL.

To describe the operation of the precharge circuit employed to emulate the voltage variation on the normal bit line, the voltage variation of the terminal precharge', the bit line BL, and the word line WL is illustrated in FIG. 8. When the voltage on the terminal precharge' is low (such as 0), the PMOS controlled by the terminal precharge' (FIG. 8) is on, the voltage on the bit line BL is Vdd, and the NMOS (such as N4' in FIG. 4) controlled by the word line WL is off. Since the voltage on the terminal precharge' changed from logic low to logic high, the PMOS is changed from on to off. And after a specific moment, the NMOS controlled by the word line WL is changed from off to on, and the voltage on the bit line BL drops linearly from Vdd till the NMOS controlled by the word line WL is switched from on to off. During the NMOS on duration, the memory cell is in "read" operation, and when the NMOS switched from high logic level (Vdd) to low logic level (0), the voltage on the bit line keeps at the voltage Vdd-$\Delta$V till the PMOS controlled by the terminal precharge switched from off to on. Then the bit line BL is charged from the voltage Vdd-$\Delta$V to Vdd. Precharge.

Figure 7:
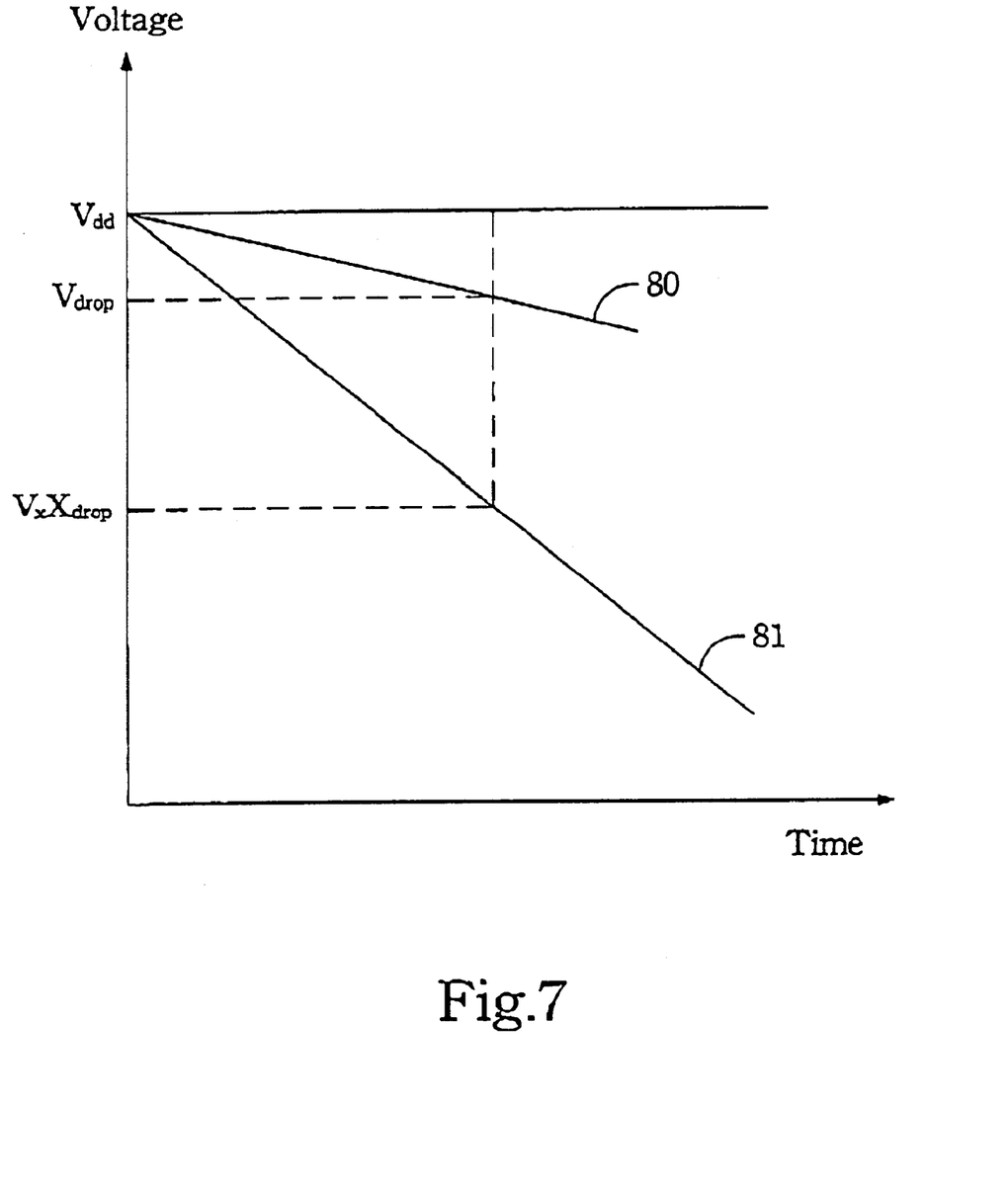
FIG. 7 illustrates the comparison of the voltage variation of the normal bit line and that of the dummy bit line of the dummy memory cell fabricated according to the preferred embodiment of the present invention.

The proportional relationship between the line 80 and line 81 is linear. For example, the voltage drop at a specific time on the normal memory cell is Vdrop, at the same time, the voltage drop on the dummy memory cell is K times Vdrop (K×Vdrop). So the linear proportional relationship may applied to various processes or transistor sizes in memory bit cell.

When the present invention is applied to a word line pulse width control circuit, the time margin, which is necessary in the prior art word line pulse width control circuit, can be spared in the present invention. In a traditional word line pulse width control circuit, to have enough voltage difference between bit lines and to have enough time for write operation, the word line pulse width con not be too small. Thus in conventional SRAM design, word line pulse width must have some extra margin to cover some worst conditions. Even though, the extra margin may not be large enough to cover some process defect on bit lines, but make the cycle time of memory suffered. This situation also makes a lot of yield loss in mass production.

A high accuracy dummy bit line circuitry (dummy memory cell array 40 in FIG. 5) may provide a negative feedback to control the word line pulse width control circuit (control circuit 46 in FIG. 5). So the word line pulse width control circuit cooperative with the dummy bit line in the present invention can highly track the activity of the normal bit lines. And the word line pulse width may be designed with the minimum width for read/write operation due to the spare of the extra margin in the present invention. The word line pulse width may varied as the bit line activity changing at different operation conditions or processes.

This may make the embedded memory design more flexible in processes fabricating the memory. With fast or typical process, it is expected the memory cell has shorter cycling time without the limit of fixed word line pulse width and without adding some extra time margin for covering some worst cases. For slow device process or minor process defects on bit lines or memory cells, the self-adjusting word line pulse circuitry will generate longer word line pulse width to prevent failure in memory. Thus, for those chip designs that may tolerate some extra memory cycling time, this present invention may have better yield regardless with the word line pulse width.

As will be understood by persons skilled in the art, the foregoing preferred embodiment of the present invention is illustrative of the present invention rather than limiting the present invention. Having described the invention in connection with a preferred embodiment, for example, if the various patterns of the loading of the dummy memory cell array are used in the preferred embodiment, the modification will now suggest itself to those skilled in the art. While the preferred embodiment of the invention has been illustrated and described, it will be appreciated that various changes and applications of the present invention can be made therein without departing from the spirit and scope of the invention.

What is claimed is:

1. A memory comprising:
a plurality of word lines for receiving an access signal;
a pair of bit lines;
a pair of load circuit connected to said pair of bit lines for applying thereto a voltage source; and
an array of memory cells, wherein voltage on said pair of bit lines coupling to said array of memory cells tracking voltage on a normal bit line when said access signal arriving a normal memory cells coupled to said normal bit line, said normal bit line being electrically coupled to said voltage source, each memory cell of said array of memory cells comprising two pairs of coupling transistors having a control terminal connected to a word line, and a pair of inverters connected in anti-parallel relationship to each other, each of said coupling transistors establishing a conductive path between one of said pair of bit lines and one of said pair of inverters responsive to said access signal to cause said pair of inverters to assume one of two binary states, gates of one of said pair of inverters being coupled to said voltage source, gates of the other of said pair of inverters being coupled to a source voltage level, a first control terminal of a first transistor of said two pairs of coupling transistors being coupled to a second control terminal of a second transistor of the other of said two pairs of coupling transistors.

2. The memory as claim 1, wherein said memory is a dual-port static random access memory (SRAM).

3. The memory as claim 1, wherein said load circuit comprises a first field effect transistor having a source-drain path connected between said voltage source and said array of memory cells, and wherein said load circuit comprises a second field effect transistor having a source-drain path connected between said voltage source and said array of memory cells.

4. The memory as claim 1, wherein said array of memory cells further comprising:
a first group of memory cells for providing current, said first group of memory cells acting as driver in said array of memory cells, each of said first group of memory cells having a first inverter assuming a first binary state, each of said first inverter being coupled to a first bit line of said pair of bit lines, each of said first group of memory cells having a first word line, said first word line of each of said first group of memory cells being coupled to access said access signal; and
a second group of memory cells for receiving said current, said second group of memory cells acting as loading in said array of memory cells, each of said second group of memory cells having a second inverter assuming a second binary state, each of said second inverter being coupled to said first bit line of said pair of bit lines, each of said second group of memory cells having a second word line, said second word line of each of said second group of memory cells being coupled to said source voltage level.

5. A memory comprising:
a plurality of word lines for receiving an access signal;
two pairs of bit lines;
two pairs of load circuit connected to said two pairs of bit lines respectively for applying thereto a voltage source; and
an array of memory cells, wherein voltage on said two pairs of bit lines coupling to said array of memory cells tracking voltage on a normal bit line when said access signal arriving a normal memory cells coupled to said normal bit line, said normal bit line being electrically coupled to said voltage source, each memory cell of said array of memory cells comprising two pairs of coupling transistors having a control terminal connected to a word line, and a pair of inverters connected in anti-parallel relationship to each other, each of said coupling transistors establishing a conductive path between one of said two pairs of bit lines and one of said pair of inverters responsive to said access signal to cause said pair of inverters to assume one of two binary states, gates of one of said pair of inverters being coupled to said voltage source, gates of the other of said pair of inverters being coupled to a source voltage level, a first control terminal of a first transistor of said two pairs of coupling transistors being coupled to a second control terminal of a second transistor of the other of said two pairs of coupling transistors.

6. The memory as claim 5, wherein said memory is a dual-port static random access memory (SRAM).

7. The memory as claim 5, wherein said two pairs of load circuits comprises a first field effect transistor having a source-drain path connected between said voltage source and said array of memory cells, and wherein said two pairs of load circuits comprises a second field effect transistor having a source-drain path connected between said voltage source and said array of memory cells, said two pairs of load circuits comprises a third field effect transistor having a source-drain path connected between said voltage source and said array of memory cells, and wherein said two pairs of load circuits comprises a fourth field effect transistor having a source-drain path connected between said voltage source and said array of memory cells.

8. The memory as claim 7, wherein gate of said first field effect transistor being coupled to gate of said third field effect transistor, gate of said second field effect transistor, and gate of said fourth field effect transistor.

9. The memory as claim 5, wherein said array of memory cells further comprising:
   a first group of memory cells for providing current, said first group of memory cells acting as driver in said array of memory cells, each of said first group of memory cells having a first inverter assuming a first binary state, each of said first inverter being coupled to a first bit line of said two pairs of bit lines, each of said first group of memory cells having a first word line, said first word line of each of said first group of memory cells being coupled to access said access signal; and
   a second group of memory cells for receiving said current, said second group of memory cells acting as loading in said array of memory cells, each of said second group of memory cells having a second inverter assuming a second binary state, each of said second inverter being coupled to said first bit line of said two pairs of bit lines, each of said second group of memory cells having a second word line, said second word line of each of said second group of memory cells being coupled to said source voltage level.

10. A circuitry for emulating activity of bit lines of a memory, said circuitry comprising:
    a plurality of word lines for receiving an access signal;
    two pairs of dummy bit lines;
    two pairs of load circuit connected to said two pairs of dummy bit lines respectively for applying thereto a voltage source;
    an array of memory cells, wherein voltage on said two pairs of dummy bit lines coupling to said array of memory cells tracking voltage on bit lines when said access signal arriving a normal memory cells coupled to said bit lines, said normal bit line being electrically coupled to said voltage source, each memory cell of said array of memory cells comprising two pairs of coupling transistors having a control terminal connected to a word line, and a pair of inverters connected in anti-parallel relationship to each other, each of said coupling transistors establishing a conductive path between one of said two pairs of dummy bit lines and one of said pair of inverters responsive to said access signal to cause said pair of inverters to assume one of two binary states, gates of one of said pair of inverters being coupled to said voltage source, gates of the other of said pair of inverters being coupled to a source voltage level, a first control terminal of a first transistor of said two pairs of coupling transistors being coupled to a second control terminal of a second transistor of the other of said two pairs of coupling transistors, wherein said array of memory cells comprising:
    a first group of memory cells for providing current, said first group of memory cells acting as driver in said array of memory cells, each of said first group of memory cells having a first inverter assuming a first binary state, each of said first inverter being coupled to a first dummy bit line of said two pairs of dummy bit lines, each of said first group of memory cells having a first word line, said first word line of each of said first group of memory cells being coupled to access said access signal; and
    a second group of memory cells for receiving said current, said second group of memory cells acting as loading in said array of memory cells, each of said second group of memory cells having a second inverter assuming a second binary state, each of said second inverter being coupled to said first dummy bit line of said two pairs of dummy bit lines, each of said second group of memory cells having a second word line, said second word line of each of said second group of memory cells being coupled to said source voltage level;
    control means for generating said access signal responding to voltage on said first bit line; and
    trigger means for coupling said first bit line to said control means.

11. The circuit as claim 10, wherein said memory is a dual-port static random access memory (SRAM).

12. The circuit as claim 10, wherein said two pairs of load circuits comprises a first field effect transistor having a source-drain path connected between said voltage source and said array of memory cells, and wherein said two pairs of load circuits comprises a second field effect transistor having a source-drain path connected between said voltage source and said array of memory cells, said two pairs of load circuits comprises a third field effect transistor having a source-drain path connected between said voltage source and said array of memory cells, and wherein said two pairs of load circuits comprises a fourth field effect transistor having a source-drain path connected between said voltage source and said array of memory cells.

13. The circuit as claim 12, wherein gate of said first field effect transistor being coupled to gate of said third field effect transistor, gate of said second field effect transistor, and gate of said fourth field effect transistor.

14. The circuit as claim 10, wherein said trigger means can be chosen from a group consisting: inverter and Schmitt trigger.

15. A dummy memory comprising:
    a plurality of word lines for receiving an access signal;
    two pairs of bit lines;
    two pairs of load circuit connected to said two pairs of bit lines respectively for applying thereto a voltage source; and
    an array of dummy memory cells, wherein voltage on said two pairs of bit lines coupling to said array of memory cells tracking voltage on a normal bit line when said access signal arriving a normal memory cells coupled to said normal bit line, said normal bit line being electrically coupled to said voltage source, wherein said array of dummy memory cells comprising:
    a first group of dummy memory cells for providing current, said first group of dummy memory cells acting as driver in said array of dummy memory cells, each of said first group of dummy memory cells having a first inverter assuming a first binary state, each of said first inverter being coupled to a first bit line of said two pairs of bit lines, each of said first group of dummy memory cells having a first word line, said first word line of each of said first group of dummy memory cells being coupled to access said access signal; and
    a second group of dummy memory cells for receiving said current, said second group of dummy memory cells acting as loading in said array of memory cells, each of said second group of dummy memory cells having a second inverter assuming a second binary state, each of said second inverter being coupled to said first bit line of said two pairs of bit lines, each of said second group of dummy memory cells having a second word line, said second word line of each of said second group of dummy memory cells being coupled to a source voltage level.

16. The memory as claim 15, wherein said memory is a dual-port static random access memory (SRAM).

17. The memory as claim 15, wherein said two pairs of load circuits comprises a first field effect transistor having a source-drain path connected between said voltage source and said array of memory cells, and wherein said two pairs of load circuits comprises a second field effect transistor having a source-drain path connected between said voltage source and said array of memory cells, said two pairs of load circuits comprises a third field effect transistor having a source-drain path connected between said voltage source and said array of memory cells, and wherein said two pairs of load circuits comprises a fourth field effect transistor having a source-drain path connected between said voltage source and said array of memory cells.

18. The memory as claim 17, wherein gate of said first field effect transistor being coupled to gate of said third field effect transistor, gate of said second field effect transistor, and gate of said fourth field effect transistor.

19. The memory as claim 15, wherein each of said array of dummy memory cells comprises two pairs of coupling transistors having a control terminal connected to a dummy word line, and a pair of inverters connected in anti-parallel relationship to each other, each of said coupling transistors establishing a conductive path between one of said two pairs of bit lines and one of said pair of inverters responsive to said access signal to cause said pair of inverters to assume one of two binary states, gates of one of said pair of inverters being coupled to said voltage source, gates of the other of said pair of inverters being coupled to said source voltage level, a first control terminal of a first transistor of said two pairs of coupling transistors being coupled to a second control terminal of a second transistor of the other of said two pairs of coupling transistors.

* * * * *